United States Patent [19]
Ochiai et al.

[11] Patent Number: 5,292,614
[45] Date of Patent: Mar. 8, 1994

[54] NEGATIVE PHOTOSENSITIVE COMPOSITION AND METHOD FOR FORMING A RESIST PATTERN

[75] Inventors: Tameichi Ochiai, Sagamihara; Noriaki Takahashi; Tomoyo Ishiguro, both of Yokohama, all of Japan

[73] Assignee: Mitsubishi Kasei Corporation, Tokyo, Japan

[21] Appl. No.: 919,941

[22] Filed: Jul. 27, 1992

[30] Foreign Application Priority Data

Aug. 2, 1991 [JP] Japan .................................. 3-194445

[51] Int. Cl.$^5$ .............................. C08F 2/46; C08F 4/04
[52] U.S. Cl. .................................... 430/270; 430/325; 522/63; 522/126; 522/51
[58] Field of Search ................ 430/270, 325; 522/126, 522/63, 51

[56] References Cited

FOREIGN PATENT DOCUMENTS

| | | |
|---|---|---|
| 0164248 | 12/1985 | European Pat. Off. |
| 0232972 | 8/1987 | European Pat. Off. |
| 54-23574 | 8/1979 | Japan. |
| 2-15270 | 1/1990 | Japan. |
| 1539192 | 1/1979 | United Kingdom. |

Primary Examiner—John Kight, III
Assistant Examiner—Rachel Johnson
Attorney, Agent, or Firm—Oblon, Spivak, McClelland, Maier & Neustadt

[57] ABSTRACT

A negative photosensitive composition comprising an alkali-soluble resin, a photo-acid-generating material and a crosslinking agent for the alkali-soluble resin, which acts under an acidic condition, wherein the crosslinking agent is a compound of the following formula (I):

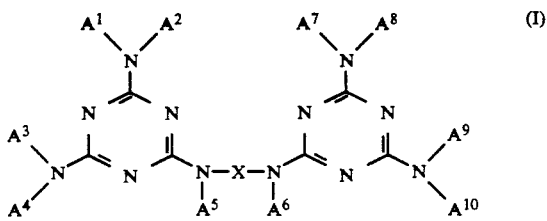

wherein each of $A^1$ to $A^{10}$ which are independent of one another, is a hydrogen atom, $-CH_2OH$ or $-CH_2OR$, wherein R is $C_1-C_4$ linear or branched chain alkyl, and X is $C_2-C_{10}$ linear or branched chain alkylene, provided that at least four among $A^1$ to $A^{10}$ are $-CH_2OR$, and a plurality of $-CH_2OR$ may be the same or different.

14 Claims, No Drawings

NEGATIVE PHOTOSENSITIVE COMPOSITION AND METHOD FOR FORMING A RESIST PATTERN

BACKGROUND OF THE INVENTION

1. Field of the Invention

The present invention generally relates to a negative photosensitive composition sensitive to radiation and a method for forming a resist pattern. More particularly, it relates to a negative photoresist suitable especially for production of semiconductor integrated circuits.

2. Discussion of Background

As generally reported, high integration of semiconductor integrated circuits progresses at a rate of four times in three years. For example, in a case of a dynamic random access memory (DRAM), a device having a memory capacity of 4 megabit DRAM is commercially available by now. Accordingly, the requirements in the photolithography technique indispensable to the production of integrated circuits have become strict year by year. For example, for the production of 4 megabit DRAM, a lithography technique at a level of 0.8 μm is required, and it is expected that for a more highly integrated circuit at a level of 16 megabit or 64 megabit DRAM, lithography at a level of 0.5 μm or 0.3 μm will be required, respectively. Accordingly, it is desired to develop a resist capable of being used for lithography of less than a half micron level.

A negative resist in which cyclized rubber and a bisazide compound as a crosslinking agent are used, is well known as a resist useful for photolithography. However, with such a negative resist, since swelling takes place during development by the action of an organic solvent used as a developer, the resolution of the resist results in 3 μm at best. Therefore, such a negative resist is not suitable for the production of a highly integrated device. Further, the organic solvent used for the development is problematic from the aspects of environmental pollution and health or in view of inflammability.

Further, a positive photoresist comprising a naphthoquinone diazide type photosensitive agent and an alkali-soluble novolak resin is well known. However, such a positive photoresist exhibits a substantial absorption at 300 nm or less and thus has a drawback that when exposure is conducted at a short wavelength, the pattern profile will be very poor. Therefore, exposure has to be conducted at a wavelength of at least about 350 nm, whereby the resolution is limited and it is not useful for lithography of less than a half micron level.

Accordingly, in order to obtain a higher resolution at present, it is conceivable to employ a light in the deep UV region for exposure using a low pressure mercury lamp or excimer laser as a light source, or to employ i-line (366 nm) or deep UV for exposure using an improved reticle with phase shifting method. However, for the phase shifting method, a negative resist is more suitable than the positive resist. Thus, a deep UV resist or a negative resist for the phase shifting method is presently desired.

Japanese Unexamined Patent Publication No. 164045/1987 discloses a negative photoresist composed of a combination of an acid curable resin and a photo-acid-generating material. Specifically, such a photoresist contains methoxymethylated melamine (Cymel® 303, trade name, manufactured by Mitsui Cyanamid) as a crosslinking agent. However, this photoresist has a problem that the pattern size dependence on the film thickness is substantial due to in-film multiple reflection.

Because of wafer topography, a film spin-coated thereon will have a thick portion and a thin portion. This level of thickness difference of the film did not create any substantial problem with the resolution at a level required heretofore. However, in order to improve the resolution, even this level of thickness difference causes a serious problem. Namely, due to the difference in the thickness of the coated resist film in one wafer which necessarily results in the coating step, the quantity of light absorbed in the film, per area, changes by the influence of the in-film multiple reflection, and accordingly, there will be a problem that the width of the resist line pattern changes. Thus, the influence of the in-film multiple reflection can no longer be ignored.

However, among negative resists for KrF excimer laser or negative resists for i-line (366 nm) phase shifting presently known for lithography of 0.3 μm level, no resist is known to provide a sufficiently small dependence of the width of the resist line pattern on the above mentioned in-film multiple reflection.

On the other hand, Japanese Unexamined Patent Publication No. 15270/1990 discloses a crosslinking agent prepared by alkoxy-methylating a urea derivative, but such a crosslinking agent still has a problem with respect to the resolution.

SUMMARY OF THE INVENTION

It is an object of the present invention to solve the above problems of the prior art and to provide a photoresist excellent in resolution, sensitivity and storage stability, with which exposure can be conducted with a light in the deep UV region and which is also applicable to a phase shifting method and thus to provide a resist excellent for lithography of less than a half micron level.

Another object of the present invention is to provide a photoresist, whose sensitivity dependence on the thickness of the coated film is sufficiently small, i.e. a photoresist in which a variation in the width of the resist line pattern due to the variation of the thickness of the coated film is sufficiently small.

A further object of the present invention is to provide a method for forming a resist pattern using such a photoresist.

The present inventors have conducted extensive studies to solve the above mentioned problems and as a result have found that a photoresist composition composed of a combination of an alkali-soluble resin, a photo-acid-generating material and a certain specific crosslinking agent is a high performance negative photoresist composition which is capable of presenting a non-swellable pattern profile with a high resolution when developed with an alkali aqueous solution after exposure and is excellent in the resolution and storage stability and yet the film thickness dependence of the width of the resist line pattern is small. The present invention has been accomplished on the basis of this discovery.

The present invention provides a negative photosensitive composition comprising an alkali-soluble resin, a photo-acid-generating material and a crosslinking agent for the alkali-soluble resin, which acts under an acidic condition, wherein the crosslinking agent is a compound of the following formula (I):

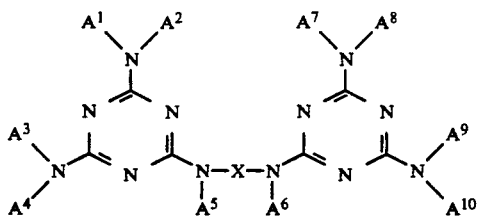

(I)

wherein each of $A^1$ to $A^{10}$ which are independent of one another, is a hydrogen atom, —$CH_2OH$ or —$CH_2OR$, wherein R is $C_1$-$C_4$ linear or branched chain alkyl, and X is $C_2$-$C_{10}$ linear or branched chain alkylene, provided that at least four among $A^1$ to $A^{10}$ are —$CH_2OR$, and a plurality of —$CH_2OR$ may be the same or different.

The present invention also provides a method for forming a resist pattern on a substrate, for a semiconductor which comprises coating the above negative photosensitive composition of the present invention on the substrate, then subjecting it to exposure by a mercury lamp or excimer laser, further subjecting it to heat treatment, followed by developing it with an alkaline aqueous solution to form a resist pattern on the substrate.

DETAILED DESCRIPTION OF THE PREFERRED EMBODIMENTS

Now, the present invention will be described in detail.

The alkali-soluble resin to be used in the present invention is not particularly limited. However, the one having a phenolic hydroxyl group is preferred. Such a resin may, for example, be a novolak resin obtained by polycondensing a hydroxyl aromatic compound such as phenol, m-cresol, p-cresol, ethylphenol, t-butylphenol, xylenol, naphthol, 1,4-dihydroxybenzene or 1,3-dihydroxybenzene, with an aldehyde such as formaldehyde, acetaldehyde, benzaldehyde or furfural, a polymer of a vinylphenol optionally having lower alkyl such as methyl or ethyl substituted on the benzene ring or on the vinyl group, i.e. a polyvinylphenol which may have a substituent such as lower alkyl, or a N-(p-hydroxyphenyl)maleimide polymer. Among them, a polyvinylphenol or a polycondensation product of cresol with formaldehyde, is preferred.

The weight average molecular weight of the alkali-soluble resin in the present invention is usually at a level of from 100 to 10,000.

On the other hand, the photo-acid-generating material to be used in the present invention is preferably a photo-acid-generating material which is able to generate an acid with a light within a range of from 150 to 400 nm. As such a photo-acid generating material, an organic halogen compound, an onium salt and a sulfonic acid ester may, for example, be mentioned. For example, it may be an onium salt or a sulfonic acid ester as disclosed by J.V. Cribelo in Polymeric Materials Science And Engineering, vol 61, p. 63 (American Chemical Society), or a photosensitive organic halogen compound as disclosed in Japanese Examined Patent Publication No. 23574/1979.

Specific examples of the onium salt include iodonium salts such as diphenyl iodonium triflate, diphenyl iodonium tosylate, diphenyl iodonium hexafluoroarsenate, diphenyl iodonium hexafluorophosphonate and diphenyl iodonium tetrafluoroborate; and sulfonium salts such as triphenylsulfonium triflate, triphenylsulfonium tosylate, triphenylsulfonium hexafluoroarsenate, triphenylsulfonium hexafluorophosphonate and triphenylsulfonium tetrafluoroborate.

Specific examples of the sulfonic acid ester include methyl p-toluenesulfonate, ethyl p-toluenesulfonate, butyl p-toluenesulfonate, phenyl p-toluenesulfonate, benzoin p-toluenesulfonate and β-tosyloxypropiophenone.

Specific examples of the photosensitive organic halogen compound include halogen-substituted paraffinic hydrocarbons such as carbon tetrabromide, iodoform, 1,2,3,4-tetrabromobutane and 1,1,2,2-tetrabromoethane; halogen-substituted cycloparaffinic hydrocarbons such as hexabromocyclohexane, hexachlorocyclohexane and hexabromocyclododecane; halogen-containing s-triazines such as tris(trichloromethyl)-s-triazine, tris(tribromomethyl)-s-triazine, tris(dibromomethyl)-s-triazine and 2,4-bis(tribromomethyl)-6-p-methoxyphenyl-s-triazine; halogen-containing benzenes such as bis(trichloromethyl)benzene and bis(tribromomethyl)benzene; halogen-containing sulfone compounds such as tribromomethylphenylsulfone, trichloromethylphenylsulfone and 2,3-dibromosulforane; and halogen-substituted isocyanurates such as tris(2,3-dibromopropyl)isocyanurate. Among such photosensitive organic halogen compounds, a bromine-containing compound is particularly preferred.

As the photo-acid-generating material, a halogen-substituted paraffinic hydrocarbon or a halogen-substituted isocyanurate is particularly preferred.

The present invention is characterized in that as a crosslinking agent which acts under an acidic condition, a compound of the above formula (I) is used.

In the above formula (I), each of $A^1$ to $A^{10}$ which may be the same or different, is a hydrogen atom, —$CH_2OH$ or —$CH_2OR$, provided that at least four among $A^1$ to $A^{10}$ are —$CH_2OR$. It is particularly preferred that at least six among $A^1$ to $A^{10}$ are —$CH_2OR$. More preferably, at least eight among $A^1$ to $A^{10}$ are —$CH_2OR$. R is $C_1$—$C_4$ linear or branched alkyl such as methyl, ethyl, n-propyl, i-propyl or n-butyl. A plurality of —$CH_2OR$ may be the same or different, but preferably the same. Particularly preferred is that R is a methyl group. X is $C_2$–$C_{10}$ alkylene which may be linear or branched, specifically, an alkylene group such as —$CH_2CH_2$—, —$CH_2CH_2CH_2$—, —$(CH_2)_6$—, —$(CH_2)_{10}$—, —$CH_2CH(CH_3)$—, —$CH_2C(CH_3)(CH_3)$—, —$CH_2CH_2CH(CH_3)$—, or —$CH_2CH_2CH(C_2H_5)$—.

The compound of the above formula (I) can be prepared by reacting 2,4-diamino-6-chloro-s-triazine with an $C_2$-$C_{10}$ alkylene diamine to obtain an alkylene bismelamine which is reacted with formaldehyde for methyrol-modification in accordance with a conventional method, followed by alkoxylation in the presence of an acid catalyst.

The product is usually a mixture of compounds having a part or whole of amino groups of the alkylene bismelamine alkoxymethylated and may further contain oligomers as by-products as well as impurities. However, such a mixture may be used as it is, as the crosslinking agent of the present invention.

Among crosslinking agents represented by the above formula (I), particularly preferred is a compound wherein X is an ethylene group, and at least eight among $A^1$ to $A^{10}$ are methoxymethyl.

The mixing proportions of the alkali-soluble resin, the photo-acid-generating material and the crosslinking agent in the photosensitive composition of the present invention are such that the photo-acid-generating material is from 0.05 to 20 parts by weight, preferably from 0.1 to 10 parts by weight, per 100 parts by weight of the alkali-soluble resin, and the crosslinking agent is from 1 to 50 parts by weight, preferably from 5 to 30 parts by weight, per 100 parts by weight of the alkali-soluble resin.

With the photosensitive compositive of the present invention, it is possible to expand the photosensitive region from the deep UV region to i-line (366 nm) or g-line (436 nm) of a mercury lamp by a combination with a long wavelength spectral sensitizer, and thus is also very useful as a resist for a phase shifting method. The sensitizer is not particularly limited, and any compound having spectral sensitizing effects can be employed. Specifically, it may, for example, be an aromatic amine such as N-phenyl-1-naphthylamine, N,N-diphenylnaphthylamine, aminopyrene, N-phenylaminopyrene, N,N-diphenylaminopyrene, triphenylamine, Hydroxytriphenylamine or N-phenyl-N-benzyl-1-naphthylamine, a phenothiazine which may be unsubstituted or substituted by e.g. alkyl, amino or alkoxy, or phenoxazine. Preferred is a phenothiazine.

The sensitizer is used usually in an amount of from 0.1 to 30 parts by weight, per 100 parts by weight of the alkali-soluble resin.

The photosensitive composition of the present invention is used usually by dissolving in a solvent. The solvent is not particularly limited, so long as it is a solvent capable of presenting adequate solubility to the resin, photo-acid-generating material and crosslinking agent and capable of providing good coating property. For example, it may be a cellosolve type solvent such as methyl cellosolve, ethyl cellosolve, methyl cellosolve acetate or ethyl cellosolve acetate, a propylene glycol type solvent such as propylene glycol monoethyl ether, propylene glycol monobutyl ether, propylene glycol monomethyl ether acetate, dipropylene glycol dimethyl ether or propylene glycol monoethyl ether acetate, an ester type solvent such as butyl acetate, amyl acetate, ethyl butyrate, butyl butyrate, diethyl oxalate, ethyl pyruvate, ethyl-2-hydroxybutyrate, 2-methyl-acetoacetate, methyl lactate or ethyl lactate, an alcohol type solvent such as heptanol, hexanol, diacetone alcohol or furfuryl alcohol, a ketone type solvent such as cyclohexanone or methylamyl ketone, or an ether type solvent such as metyl phenyl ether or diethylene glycol dimethyl ether, a high polar solvent such as dimethylformamide or N-methylpyrrolidone, or a solvent mixture thereof, or a solvent mixture having an aromatic hydrocarbon added thereto.

The solvent is used preferably in an amount of from 1 to 20 times by weight relative to the total amount of the solid content of the photosensitive composition.

Further, the photosensitive composition of the present invention may contain various additives such as a surfactant, a coating property-improving agent, a stabilizer, a colorant and an ultraviolet absorber, to such an extent not to impair the desired properties.

The negative photosensitive composition of the present invention is useful as a photoresist. To form a resist pattern on a substrate for a semiconductor by using the negative photosensitive composition of the present invention, the negative photosensitive composition dissolved in the above-mentioned solvent is usually coated on the substrate for the semiconductor and then subjected to exposure, heating after the exposure (post exposure bake: PEB) and development.

The substrate for the semiconductor is the one commonly used as a substrate for the production of semiconductors, and it may, for example, be a silicon substrate or a gallium-arsenic substrate. For the coating, a spin coater is usually employed, and the film thickness is usually from 0.5 to 2 $\mu$m.

For the exposure, a light in the deep UV region, for example, a light of 254 nm from a light source of a low pressure mercury lamp, or a light of 157 nm, 193 nm, 222 nm or 249 nm from a light source of e.g. an excimer laser, is suitably employed. Further, with use of a sensitizer, a light of 366 nm or 436 nm from a high pressure mercury lamp may also be employed. The light for the exposure may not necessarily be a monochromatic light and may be broad. Further, the composition of the present invention is useful also as a resist for a phase shifting method.

The heating after exposure (PEB) is preferably conducted under such conditions as from 90 to 140° C. for from 1 to 10 minutes by means of a hot plate. Instead of the hot plate, a convection oven may be employed. In this case, however, a long time is usually required than in the case where a hot plate is employed.

As the developer, an alkali developer is suitably employed which is an aqueous solution of an alkaline compound, such as an inorganic alkali such as potassium hydroxide, sodium carbonate, sodium silicate, sodium metasilicate or aqueous ammonia, a primary amine such as ethylamine or n-propylamine, a secondary amine such as diethylamine or di-n-propylamine, a tertiary amine such as triethylamine or trimethylamine or a quaternary ammonium salt such as tetramethylammonium hydroxide or trimethylhydroxyethylammonium hydroxide. To the developer, an alcohol, a surfactant, etc. may be incorporated as the case requires.

The photoresist solution and the developing solution are usually filtered to remove insolubles before use.

The negative photosensitive composition of the present invention is useful not only for the production of very large scale integrated circuits, but also for the production of common integrated circuits. Further, it is useful as a photoresist or solder resist for the production of masks, for the preparation of a printing plate such as lithograph, intaglio or relief or for the preparation of a printed circuit, or as a material for forming an image such as a relief image or a reproduced image. It is also useful for e.g. a photocurable ink, a coating material or an adhesive.

With the negative photosensitive composition of the present invention, it is possible to obtain a pattern profile of high resolution by exposure with a light having a wavelength in the deep UV region, and when used in combination with a sensitizer, the negative photosensitive composition of the present invention exhibits a high resolution by exposure with i-line. Accordingly, it is extremely useful as a photoresist particularly for the production of very large scale integrated circuits and common integrated circuits.

Now, the present invention will be described in further detail with reference to Examples. However, it should be understood that the present invention is by no means restricted by such specific Examples.

PREPARATION EXAMPLE 1

29.1 g of 2,4-diamino-6-chloro-s-triazine was added to 300 ml of water to obtain a slurry. Then 6 g of ethylenediamine was added thereto, and the mixture was stirred for 15 minutes. Then, 16 g of a 25 wt% sodium hydroxide aqueous solution was added thereto, and the mixture was refluxed under heating for two hours. At that time, about 3 g of a 25 wt% sodium hydroxide aqueous solution was further gradually added over a period of two hours to maintain the reaction solution in a weakly alkaline state. After completion of the reaction, the reaction mixture was left to cool, whereupon the crystals were collected by filtration and washed with water to obtain 25.3 g of ethylenebismelamine. Then, 5.9 g of ethylenebismelamine and 17 g of formaline were mixed, and mixture was subjected to a heating reaction at 90° C. for 4 hours while maintaining the mixture at pH 9 to 10 with an aqueous sodium hydroxide solution. Then, the formed methylol product was taken out, and 30 ml of methanol was added thereto. The mixture was adjusted to pH 4 with hydrochloric acid. After the solution became uniform, it was heated for 5 minutes and neutralized. Then, methanol was distilled off to obtain 3.2 g of methoxymethylated ethylenebismelamine. The product was analyzed by IR and NMR and was found to be a mixture containing octamethoxymethylethylenebismelamine as the main component.

PREPARATION EXAMPLE 2

In the same manner as in Preparation Example 1 except that 7.4 g of 1,2-propanediamine was used instead of ethylenediamine, a mixture containing octamethoxymethyl1,2-propylenebismelamine as the main component, was obtained.

PREPARATION EXAMPLE 3 PREPARATION

In the same manner as in Preparation Example 1 except that 8.8 g of 1,4-butylenediamine was used instead of ethylenediamine, a mixture containing octamethoxymethylbutylenebismelamine as the main component, was obtained.

PREPARATION EXAMPLE 4

In the same manner as in Preparation Example 1 except that 10.2 g of formaline was used, a mixture containing hexamethoxymethylethylenebismelamine as the main component, was obtained.

EXAMPLES 1 TO 4

20 g of polyvinylphenol having an average molecular weight of 5,100, 4 g of a crosslinking agent containing the compound as identified in Table 1 as the main component, prepared in one of Preparation Examples 1 to 4 and 1 g of 1,2,3,4-tetrabromobutane as a photo-acid-generating material, were dissolved in 70 g of ethyl lactate, and the solution was filtered through a teflon filter paper of 0.2 μm to obtain a photoresist composition. This photoresist composition was coated in a thickness of 1.0 μm on a silicon wafer having a diameter of 4 inch by a spin coater (1H-2D, manufactured by Mikasa), followed by drying at 100° C. for 70 seconds on a hot plate. The coated wafer was subjected to exposure by changing the exposure energy by means of a KrF excimer laser reduction step-and-repeat projection exposure apparatus. Then, the wafer was heated at 110° C. for 90 seconds on a hot plate (PEB). Then, it was developed for 70 seconds with a 1.23% tetramethyl ammonium hydroxide aqueous solution to form a negative image. The obtained resist pattern was inspected by a scanning electron microscope (manufactured by Akashi Seisakusho), whereby a line and space of 0.35 μm was resolved, and the resolution was excellent, in such Example.

TABLE 1

| No. | Prep. Example No. | Main component of the crosslinking agent (formula (I)) | |
|---|---|---|---|
| | | $A^1$-$A^{10}$ | —X— |
| Example 1 | 1 | Eight are —CH$_2$OCH$_3$, and two are —H | —CH$_2$CH$_2$— |
| Example 2 | 2 | Same as above | —CH$_2$—CH(CH$_3$)— |
| Example 3 | 3 | Same as above | —CH$_2$CH$_2$CH$_2$CH$_2$— |
| Example 4 | 4 | Six are —CH$_2$OCH$_3$ and four are —H | —CH$_2$CH$_2$— |

EXAMPLE 5

20 g of a novolak resin prepared by condensing 8 parts by weight of m-cresol and 2 parts by weight of p-cresol with formaline and having a weight average molecular weight of 5,000, 4 g of the compound used as a crosslinking agent in Example 1, 1 g of tris(2,3-dibromopropyl)isocyanulate as a photo-acid-generating material and 1 g of phenothiazine as a sensitizer, were dissolved in 70 g of propylene glycol monoethylether acetate. The mixture was filtered through a teflon filter paper of 0.2 μm to obtain a photoresist composition. This photoresist composition was coated in a thickness of 1.0 μm on a silicon wafer having a diameter of 4 inch by means of a spin coater (1H-2D, manufactured by Mikasa), followed by drying at 100° C. for 70 seconds on a hot plate. The coated wafer was subjected to exposure by changing the exposure energy by means of an i-line (366 nm) reduction step-and-repeat projection exposure apparatus and then heated at 110° C. for 90 seconds on a hot plate (PEB). Then, it was developed for 70 seconds with a 2.38% tetramethylammonium hydroxide aqueous solution to form a negative image. The obtained resist pattern was inspected by a scanning electron microscope (manufactured by Akashi Seisakusho), whereby a line and space of 0.40 μm was resolved, and the resolution was excellent.

EXAMPLE 6

The photoresist composition prepared in Example 1 was coated on twelve silicon wafers in various thicknesses within a range of 7,000+400 Å as dried film thicknesses. The coated wafers are dried at 110° C. for 70 seconds, followed by exposure, PEB and development in the same manner as in Example 1 to obtain a resist line and space pattern of 0.50 μm of a mask pattern. With respect to the twelve wafers, the width of the resist lines were measured.

As the thickness changed, the width of the resist line pattern changed due to in-film multiple reflection. The change in the width was 0.05 μm. Namely, the resist widths of all the twelve wafers were within a range of from 0.475 to 0.525 μm.

Further, with respect to all the twelve samples, a line and space of 0.35 μm was resolved.

In a separated experiment, the above photoresist composition was coated in a film thickness of 0.70 μm on a quartz wafer, and the absorption coefficient and the transmittance were measured. Whereby the absorption coefficient (248 nm) was 0.38, and the transmittance (248 nm) was 42%. Namely, the absorption of the light of 248 nm in the resist film was sufficiently large, the variation in the width of the resist line pattern due to the in-film multiple reflection was small, and thus the film thickness dependence of the width of the resist line was low.

COMPARATIVE EXAMPLE 1

Evaluation of twelve samples were conducted in the same manner as in Example 6 except that the crosslinking agent for the photoresist composition of Example 1 was changed to 4 g of Cymel ®300 (melamine resin) manufactured by Mitsui Cyanamid. The change in the width of the resist line pattern of the mask of the line and space of 0.50 μm was within a range of 0.12 μm due to in-film multiple reflection. Namely, the width of the resist line varied within a wide range of from 0.440 μm to 0.560 μm.

Further, among twelve samples, three samples had the width of the resist lines larger than the mask, and the line and space of 0.35 μm was not resolved.

Further, the absorption coefficient and the transmittance of the photoresist composition with a film thickness of 0.70 μm were 0.22 (248 nm) and 60% (248 nm), respectively. Namely, the transmittance of the light of 248 nm was so much that the variation in the width of the resist line due to the in-film multiple reflection was large, and the film thickness dependence of the width of the resist line was substantial.

What is claimed is:

1. A negative photosensitive composition comprising an alkali-soluble resin having phenolic hydroxyl groups, a photo-acid-generating material selected from the group consisting of an organic halogen compound, an onium salt and a sulfonic acid ester and a crosslinking agent for the alkali-soluble resin, which acts under an acidic condition, wherein the crosslinking agent is a compound of the following formula (I):

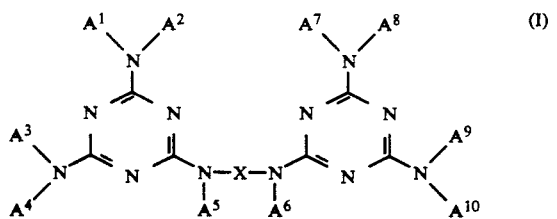

wherein each of $A^1$ to $A^{10}$ which are independent of one another, is a hydrogen atom, —$CH_2OH$ or —$CH_2OR$, wherein R is $C_1$–$C_4$ linear or branched chain alkyl, and X is $C_2$–$C_{10}$ linear or branched chain alkylene, provided that at least four among $A^1$ to $A^{10}$ are —$CH_2OR$, and a plurality of —$CH_2OR$ may be the same or different.

2. The negative photosensitive composition according to claim 1, wherein X in the formula (I) is $C_2$–$C_4$ alkylene.

3. The negative photosensitive composition according to claim 1, wherein at least six among $A^1$ to $A^{10}$ in the formula (I) are —$CH_2OR$.

4. The negative photosensitive composition according to claim 1, wherein R in the formula (I) is methyl.

5. The negative photosensitive composition according to claim 1, wherein X in the formula (I) is ethylene, and at least eight among $A^1$ to $A^{10}$ in the formula (I) are methoxymethyl.

6. The negative photosensitive composition according to claim 1, wherein the alkali-soluble resin is a polyvinylphenol.

7. The negative photosensitive composition according to claim 1, wherein the alkali-soluble resin is a novolak resin.

8. The negative photosensitive composition according to claim 1, wherein the alkali-soluble resin is a polycondensation product of cresol with formaldehyde.

9. The negative photosensitive composition according to claim 1, wherein the photo-acid-generating material is an organic halogen compound.

10. The negative photosensitive composition according to claim 1, wherein the photo-acid-generating material is a halogen-substituted paraffinic hydrocarbon or a halogen-substituted isocyanurate.

11. The negative photosensitive composition according to claim 1, wherein the proportions of the alkali-soluble resin, the photo-acid-generating material and the crosslinking agent are such that the photo-acid-generating material is from 0.05 to 20 parts by weight, and the crosslinking agent is from 1 to 50 parts by weight, per 100 parts by weight of the alkali-soluble resin.

12. The negative photosensitive composition according to claim 1, wherein the proportions of the alkali-soluble resin, the photo-acid-generating material and the crosslinking agent are such that the photo-acid-generating material is from 0.1 to 10 parts by weight, and the crosslinking agent is from 5 to 30 parts by weight, per 100 parts by weight of the alkali-soluble resin.

13. The negative photosensitive composition according to claim 1, which further contains a phenothiazine as a sensitizer.

14. A method for forming a resist pattern on a substrate for a semiconductor, which comprises coating on the substrate a negative photosensitive composition comprising an alkali-soluble resin having phenolic hydroxyl groups, a photo-acid-generating material selected from the group consisting of an organic halogen compound, an onium salt and a sulfonic acid ester and a crosslinking agent for the alkali-soluble resin, which acts under an acidic condition, wherein the crosslinking agent is a compound of the following formula (I):

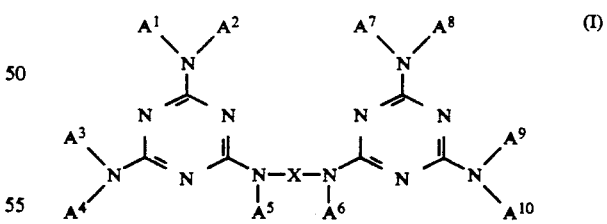

wherein each of $A^1$ to $A^{10}$ which are independent of one another, is a hydrogen atom, —$CH_2OH$ or —$CH_2OR$, wherein R is $C_1$–$C_4$ linear or branched chain alkyl, and X is $C_2$–$C_{10}$ linear or branched chain alkylene, provided that at least four among $A^1$ to $A^{10}$ are —$CH_2OR$, and a plurality of —$CH_2OR$ may be the same or different subjecting it to exposure by means of a mercury lamp or excimer laser to copy a pattern, further subjecting it to heat treatment and then developing it with an alkali aqueous solution to form a resist pattern on the substrate.

* * * * *